(12) United States Patent
Geuppert et al.

(10) Patent No.: US 9,551,944 B2
(45) Date of Patent: Jan. 24, 2017

(54) METHOD FOR REPLACING OBJECTIVE PARTS

(71) Applicant: Carl Zeiss SMT GMBH, Oberkochen (DE)

(72) Inventors: Bernhard Geuppert, Aalen (DE); Guido Limbach, Aalen (DE); Harald Woelfle, Waldkirch (DE); Peter Deufel, Koenigsbronn (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 14/467,609

(22) Filed: Aug. 25, 2014

(65) Prior Publication Data

US 2014/0359990 A1 Dec. 11, 2014

Related U.S. Application Data

(60) Division of application No. 12/430,633, filed on Apr. 27, 2009, now abandoned, which is a continuation of
(Continued)

(30) Foreign Application Priority Data

Oct. 27, 2006 (DE) .................. 10 2006 050 835

(51) Int. Cl.
*B08B 7/00* (2006.01)
*B08B 7/04* (2006.01)
*G03F 7/20* (2006.01)
(Continued)

(52) U.S. Cl.
CPC ............ *G03F 7/70925* (2013.01); *B08B 3/12* (2013.01); *B08B 7/0035* (2013.01); *B23P 6/00* (2013.01);
(Continued)

(58) Field of Classification Search
CPC ............ G03F 7/70808; G03F 7/70825; G03F 7/70833; G03F 7/70916; G03F 7/70975; G03F 7/70925; B08B 3/13; B08B 3/12; B08B 3/70035; B23P 6/00
(Continued)

(56) References Cited

U.S. PATENT DOCUMENTS

2001/0026355 A1 10/2001 Aoki et al.
2004/0017167 A1 1/2004 Nishi
(Continued)

FOREIGN PATENT DOCUMENTS

EP 1387217 A2 2/2004
JP 11288870 A 10/1999
(Continued)

*Primary Examiner* — Alexander Markoff
(74) *Attorney, Agent, or Firm* — Edell, Shapiro & Finnan, LLC

(57) ABSTRACT

A method and a device for replacing objective parts, especially of a projection or illumination objective for microlithography in which an objective having an objective interior and objective parts provided therein is provided. At least one objective part is replaceably accommodated in the objective. Immediately prior to installation in the objective, the replaceable objective part is cleaned outside the objective interior in at least one cleaning room sealed off from the ambient atmosphere. Immediately after cleaning, the replaceable objective is installed in the objective without contact with the normal ambient atmosphere.

20 Claims, 7 Drawing Sheets

Related U.S. Application Data application No. PCT/EP2007/061563, filed on Oct. 26, 2007.

(51) Int. Cl.
    *B08B 3/12*     (2006.01)
    *B23P 6/00*     (2006.01)

(52) U.S. Cl.
    CPC ....... *G03F 7/70808* (2013.01); *G03F 7/70825* (2013.01); *G03F 7/70833* (2013.01); *G03F 7/70916* (2013.01); *G03F 7/70975* (2013.01); *Y10T 29/49723* (2015.01)

(58) Field of Classification Search
    USPC ....... 134/1, 1.1, 2, 3, 21, 26, 30, 32, 34, 37, 134/39; 156/345.31; 355/30, 53, 55
    See application file for complete search history.

(56) References Cited

U.S. PATENT DOCUMENTS

| | | |
|---|---|---|
| 2005/0030504 A1 | 2/2005 | Terashima et al. |
| 2006/0001854 A1 | 1/2006 | Singer et al. |
| 2006/0023185 A1 | 2/2006 | Hazelton et al. |
| 2006/0176460 A1 | 8/2006 | Phillips et al. |
| 2007/0053076 A1 | 3/2007 | Bieg et al. |
| 2008/0137192 A1 | 6/2008 | Soyez et al. |
| 2008/0170303 A1 | 7/2008 | Bieg et al. |

FOREIGN PATENT DOCUMENTS

| | | |
|---|---|---|
| JP | 2005268358 A | 9/2005 |
| JP | 2006069755 A2 | 7/2006 |
| WO | 2006079537 A2 | 8/2006 |
| WO | 2008034582 A2 | 3/2008 |

METHOD FOR REPLACING OBJECTIVE PARTS

CROSS REFERENCE TO RELATED APPLICATIONS

This application is a divisional of U.S. patent application Ser. No. 12/430,633 filed Apr. 27, 2009, entitled "Method and Device for Replacing Objective Parts," which is a continuation of International Application PCT/EP2007/061563, with an international filing date of Oct. 26, 2007, which was published under PCT Article 21(2) in German, which claims priority under 35 U.S.C. §119 to German Application No. DE 10 2006 050 835.1 filed on Oct. 27, 2006, the complete disclosures of each of which, including amendments, are incorporated into this application by reference.

FIELD OF AND BACKGROUND OF THE INVENTION

The present divisional application relates to a method for replacing objective parts, especially of a projection or illumination objective for microlithography.

Modern lenses in lithography increasingly have replaceable or exchangeable elements, such as replaceable or exchangeable lenses, filters, diaphragms and the like. US 2006/0176460 A1 describes, for example, an EUV (extreme ultraviolet) lithography system having optical elements, such as mirrors and the like, which are individually selectable for use, wherein the optical elements are not replaced, in the sense of being moved into and out of the objective, but rather are exchanged only in the form of a rotatable turret. However, this imposes a very high space requirement.

WO 2006/069755 A1 describes, in contrast, a replaceable optical element of an objective module of a lithography system, which can be completely removed from the objective, wherein a proposal is made to avoid contamination of the objective room by providing a load-lock chamber.

When parts located in the highly clean, gas-flushed or evacuated objective interior are replaced, there is a problem that the process of replacement can introduce impurities into the objective. In addition to contamination via the gas room during the replacement, contaminants adhering to the replaceable components can be introduced into the objective, said contaminants subsequently capable of leading to a deterioration of the objective characteristics. Possible contaminants in this context are particularly hydrocarbons, water deposits and other particles.

The hydrocarbons, which are mostly present in the form of monolayers on the surface of the replacement parts, mostly do not become detached until irradiation with the objective light used for imaging, for example, UV laser light. Accordingly, unless further cleaning takes place, this means that hydrocarbons are present in the objective and can then enter into chemical reactions at undesirable regions, and so lead to deposits on the optical elements. As a result, the imaging properties of the objective are impaired.

Similar considerations apply to monolayers of water, which are also present on replacement parts that are exposed to the ambient atmosphere. In the normally extremely dry environment within the objective, the water monolayers desorb or evaporate and are then also in the objective, as a result of which ozone, which is highly reactive, can form due to UV light. The water molecules, too, can then enter into reactions, for example, with hydrocarbons that are also present in the objective interior or with other components in the objective interior, such that, due to the monolayers of water as well, deposits can form on the surfaces of the optical elements, especially salts. To prevent imaging damage, US 2006/0001854 A1 accordingly proposes the provision of optical elements having several usable areas in the objective, such that, following contamination of one area, a different, clean area can be moved into the beam, while the contaminated area can be cleaned.

JP 11288870 A proposes exchanging contaminated areas and subsequent cleaning of the contaminated areas for a protective device between the projection objective and the wafer of a lithography system.

A further problem of replaceable components of the optical system of a lithography system is that particles adhering to the replacement parts can become detached from the replacement parts and precipitate on the surfaces of the optical elements, a fact which also impairs the imaging properties.

These problems have so far been counteracted by cleaning the replaced objective parts or the objective interior with cleaning gas for an adequate length of time. As a result, the desorbed or evaporated water monolayers or the hydrocarbons or residual parts thereof which have been transferred into the gas phase during illumination are driven out of the objective, such that the corresponding negative deposits are avoided.

However, this approach has the disadvantage that, first, the contaminants are introduced into the objective interior and there is a risk that, on account of the subsequent cleaning, said contaminants are not completely removed from the objective interior, such that, for example, a device according to US 2006/0001854 A1 is required. Furthermore, this approach means that the objective is inoperable for a long period because, during this time, cleaning takes place after the corresponding parts of the objective have been replaced.

Accordingly, the proposed solution was to avoid contamination of replaceable objective parts by preventing the parts for installation into the objective from being exposed to the ambient atmosphere after production and cleaning. This means, however, that the entire transport chain from storage to transport right into the objective must be carried out in a correspondingly clean atmosphere, a fact which represents considerable outlay. Moreover, there is a risk that, in storage, tiny amounts of contaminants in the sealed atmosphere around the replaceable objective part will in turn lead to deposits.

OBJECTS AND SUMMARY OF THE INVENTION

It is therefore an object of the present application to provide a method to replace objective parts for the purpose of largely avoiding introduction of contaminants into the objective interior, wherein the replacement is to be conducted in an effective and easy way. Especially, rapid replacement of objective parts with short downtimes for the objective is to be made possible while the problems of the prior art are avoided.

The above-mentioned objects are achieved, in whole or in part by methods as disclosed and claimed herein, preferably in combination with cleaning devices, objectives and systems as disclosed and claimed herein. Advantageous embodiments are also disclosed and claimed in particular through dependent claims.

The present invention proceeds from the insight that the introduction of contaminants into the objective interior can be effectively prevented during objective parts replacement by cleaning the replaceable objective part outside the objective interior immediately prior to installation into the objective and immediately installing it in the objective after the cleaning and without contact with the normal ambient atmosphere. Instead of downstream cleaning of optical elements which become contaminated by contaminants present in the objective, as is proposed in US 2006/0001854 A1, the approach of the present invention is pre-emptive avoidance of contamination. The immediate installation of the replaceable objective part in the objective immediately after cleaning, without further contact with the normal ambient atmosphere, has the advantage of minimising the effort of handling the cleaned objective part under exclusion of the normal ambient atmosphere, and also prevents contaminant deposits from recurring on the replaceable objective part after cleaning. Similarly, immediate installation directly after cleaning means that only as much time is available until commencement of transfer into the objective as is necessary for the stages of the transfer process, or, that less time remains than is required for appreciable deposition of contaminants. Essentially, therefore, the immediate installation proceeds without any time delay directly after cleaning of the replaceable objective part. However, in isolated cases, short intermediate storage times ranging from a few minutes to several hours are possible. In normal circumstances, however, installation of the replaceable objective part is commenced or completed less than 30 minutes, preferably less than 15 minutes, especially from a few minutes to several seconds after cleaning.

The replaceable objective parts can be all parts present in an objective or optical system, particularly optical lenses, mirrors, mirror elements, filters, diaphragms, membranes and the like.

By replaceable is particularly understood that the corresponding objective part can be removed completely from the objective interior, i.e. completely leaves a housing that seals the objective interior. Accordingly, replaceable objective parts differ from merely exchangeable objective parts in that, in the removed state, they are completely separate from the objective or can be simply separated from it.

By objective is understood any optical system, even where no object is imaged onto an image plane, for example, illumination systems of microlithography systems. The corresponding objectives or optical systems can be operated at all kinds of wavelengths, especially the wavelengths used for microlithography in the range of 248 nm, 193 nm, 157 nm as well as in the extreme ultraviolet light range of wavelengths less than 30 nm, especially in the range of 13 nm and 13.5 nm. Generally, the invention can be realized for optical systems that use all kinds of wavelengths.

Cleaning of the replaceable objective part takes place in a sealed cleaning room to ensure that defined cleaning can take place. Preferably, the cleaning room has a cleaning atmosphere different from that of the ambient atmosphere, such that precisely the contaminants in the ambient atmosphere, such as water, hydrocarbons and particles can be removed effectively from the objective part to be cleaned. The cleaning atmosphere can be formed by vacuum, dry air, nitrogen, dry nitrogen, argon, oxygen, helium, hydrogen, general inert gases or noble gases and combinations thereof.

The cleaning atmosphere can also be different from the atmosphere in the objective interior, with, however, the atmosphere in the objective interior also capable of being formed by inert gases or noble gases, nitrogen, dry nitrogen and combinations thereof and vacuum.

The cleaning room sealed off from the ambient atmosphere can be provided in such local proximity to the objective interior or arranged there such that a geometrically simple replacement movement for the objective part or a temporally and/or locally particularly short replacement movement is possible. This has the advantage of keeping the handling effort for the cleaned objective part low.

By geometrically simple movement can be understood a linear movement or a swivelling or rotational movement of the replacement part or generally a movement which can be effected with simple transport.

A short temporal movement corresponds to the above-defined immediate arrangement in the objective directly after cleaning and corresponds to the definitions specified there.

In an advantageous embodiment of the invention, the cleaning room is detachably coupled to the objective interior so as to be gastight, such that, advantageously, a direct connection is possible between the cleaning room and objective interior, at least during installation and removal of the replaceable objective part.

The detachable coupling of the cleaning room particularly ensures that the effort for handling the cleaned replacement part is kept low. Moreover, the detachable arrangement can permit flexible use of the cleaning device containing the cleaning room. This can be coupled to the corresponding coupling point of the objective housing only in the event of a necessary replacement, without there being any need for a permanent stationary arrangement, although this is of course conceivable. Thus, for example, a service technician can bring a required replacement part and the mobile cleaning device to the location of the objective to arrange the cleaning device at the objective there, to remove the old part from the objective and to install in the objective the new replacement part after cleaning in the cleaning device. This ensures a high degree of flexibility and versatility.

The cleaning device can have a magazine for replaceable objective parts or can interact with this. This allows different filters, diaphragms, lenses, mirrors, prisms and the like to be used in the objective, without causing major downtimes. By means of the combination of a cleaning device with a magazine for replaceable objective parts, such as filters, diaphragms, lenses, mirrors, prisms and the like, a replacement of objective parts can be effected between two process stages of objective use, such that the imaging properties of the objective can be coordinated with the successive process steps of the objective use, without causing major downtimes of the objective. In the magazine, the replaceable objective parts can be stored in the same atmosphere that prevails in the cleaning room or in a separate atmosphere, which largely avoids contamination during storage in the magazine. Nevertheless, additional cleaning can take place through introduction via the cleaning room. Moreover, during the periods in which no replacement takes place, the objective parts stored in the magazine can undergo cleaning by repeated movement into the cleaning room.

According to a further advantageous embodiment of the invention, several cleaning devices or cleaning rooms can be provided or be attachable to the objective or to each other. This enables different cleaning methods and stages to be executed.

Thus, for cleaning removable objective parts, different cleaning processes can be used, which preferably can comprise cleaning by irradiation with electromagnetic waves, especially ultraviolet radiation, plasma cleaning, especially hydrogen or oxygen plasma cleaning, evaporation, gas cleaning, liquid cleaning, ultrasonic cleaning, dipping baths, mechanical cleaning, especially wiping and the like, and combinations thereof.

These methods serve to eliminate particles, hydrocarbons and water monolayers. The cleaning method can relate to the elimination of one or more of these contaminants, more precisely through a combination of several or all of the method steps for the purpose of eliminating these contaminants. Where several cleaning steps are combined, it is advantageous to eliminate particles first, then hydrocarbons and then water monolayers. Especially, the elimination of water monolayers after the removal of hydrocarbons is advantageous because, during the elimination of the hydrocarbons, for example, by irradiation with ultraviolet light (UV irradiation), the presence of a certain quantity of water molecules is advantageous. The presence of water accelerates the elimination of hydrocarbons since free-radicals are produced from water molecules during irradiation.

For the elimination of particles, the use of ultrasonic baths, dipping baths with optics-cleaning mixtures and mechanical wiping of the surface of the objective parts to be replaced is possible. The applicable optics-cleaning mixtures are generally known to a person skilled in the art of optics, with corresponding mixtures of alcohols and the like being used that are absolutely residue-free.

For the elimination of hydrocarbons, irradiation of the replaceable objective part with electromagnetic radiation, preferably ultraviolet light, is suitable, with a cleaning flow capable of being adjusted simultaneously in the cleaning room of the cleaning device in order that hydrocarbons transferred to the gas phase or residues thereof may be flushed from the cleaning room. To this end, dry nitrogen with a low oxygen proportion, dry air or other gas mixtures containing oxygen are suitable. Removal of hydrocarbons may also be effected by plasma cleaning, with both low pressure plasma under vacuum conditions (~0.1 bar) as well as a plasma at atmospheric pressure being possible. Especially, oxygen and hydrogen make suitable gases for the low-pressure plasma, but other gases such as argon can be used also. A particularly advantageous method for generating the plasma consists in excitement by microwaves, for which purpose a corresponding microwave head in a corresponding cleaning device may be simply provided. By the aforementioned vacuum is meant a technical vacuum which can be generated by corresponding extraction devices, such as pumps.

Elimination of water monolayers may be effected by evaporative heating of the replaceable objective part in addition to using plasma cleaning and here especially of plasma cleaning in a vacuum. Heating may be effected by an infrared lamp or a heating wire. Moreover, the removal of water monolayers can be achieved by cleaning for a sufficiently long period with cleaning gas, for example dry nitrogen or dry air and helium. This cleaning is rendered advantageous by the present invention in that the objective does not have to be decommissioned during cleaning of the replacement part and thus sufficiently long cleaning times are facilitated. This is particularly true if the cleaning device is designed such that, during the replacement process at least, both the old replaceable objective part as well as the new replaceable objective part may be accommodated in the cleaning device, such that, as it were, the objective parts can be exchanged on the fly.

A cleaning device according to the present invention includes a cleaning room for accommodating and cleaning the replaceable objective part and a connecting part for gastight connection to an objective housing. The cleaning device can be detachably connected to an objective, especially an illumination or projection objective for microlithography.

It is also advantageous for the cleaning device to have further connection possibilities for, for example, a transport channel and/or one or more further cleaning devices, such that the previously described use of several cleaning rooms or cleaning devices and the application of different cleaning steps, especially in succession, is possible. The provision of a transport channel, especially a transport channel which can be arranged at the cleaning room, is advantageous because that increases the versatility of the cleaning device.

This is further boosted by forming both the connecting part of the cleaning device for the gastight connection to the objective housing and the connecting element for the gastight connection of a transport channel and one or more further cleaning devices so that they are identical and/or compatible with each other.

In order to prevent vibrations caused by cleaning or handling of the replaceable objective part in the cleaning device from being transmitted into the objective, it is advantageous for the connecting element to the gastight connection of a transport channel and/or cleaning devices as well as the connecting part for the cleaning room or the cleaning device to the objective housing to have a device for the purpose of mechanical decoupling combined with maintenance of the sealing effect, such as a gas bearing with leaky seal with excess pressure or corresponding elastic elements, such as a bellows.

The cleaning room of the cleaning device can preferably be sealed gastight, with the exception of a gas inlet and gas outlet for the cleaning flow, in order that penetration by contaminants may be avoided. To this end, sealing elements are provided at the inlet openings for the objective part to be cleaned and/or at the connecting parts or elements. Sealing elements can be formed by the commonly known sealing elements in the form of elastic elements or gap seals, so-called leaky seals, in which excess pressure ensures that no contaminants can penetrate from the outside through the gap present.

The cleaning device can have a handling device, by means of which the replaceable objective part can be moved either only in the cleaning device or both in the cleaning device and for the purpose of movement into and out of the objective. Alternatively, the handling device for the replaceable objective part can also be integrated at the objective.

The kinematic parts of the handling device may be partially or completely arranged within the housing of the cleaning room or the transport channel. By kinematic parts is understood all movable parts. This means, for example, that only inherently non-movable control or operating elements are provided outside the cleaning room or the cleaning device or at the outside of the cleaning device. For example, this is the case if all parts, such as motor, transmissions and the like are provided inside the cleaning device and only the electrical power supply and control unit are outside.

It is also conceivable for the drive of the handling device to be provided outside the cleaning device, although in that event a gastight or vacuum-tight through-guide for a movable part, such as a rod, can be provided. To avoid this, a non-contact drive, for example, utilizing magnetic forces, can also be provided. Especially, the handling device can comprise a linear motor.

Like the connecting parts or connecting elements, the handling device can also be arranged so as to be mechanically decoupled from the housing of the cleaning room and/or a transport channel, for which purpose an air bearing can be used. Basically, all kinds of handling devices can find application.

The cleaning device comprises all means, devices and equipment needed for implementing the aforementioned method, for example, arrangements for introducing and extracting gas, or corresponding elements for connecting such arrangements, such as pumps, vacuum pumps, gas supply devices and the like, as well as corresponding cleaning devices, such as UV lamps, plasma generators, such as microwave heads, evaporators, IR lamps, heating wires, etc.

BRIEF DESCRIPTION OF THE DRAWINGS

Further advantages, characteristics and features of the present invention are apparent from the following detailed description of embodiments using the enclosed drawings. The drawings show in purely schematic form in FIG. 1 a cross-section of a part of an objective with docked cleaning device and a handling device.

PREFERRED EMBODIMENTS

Figure 1:
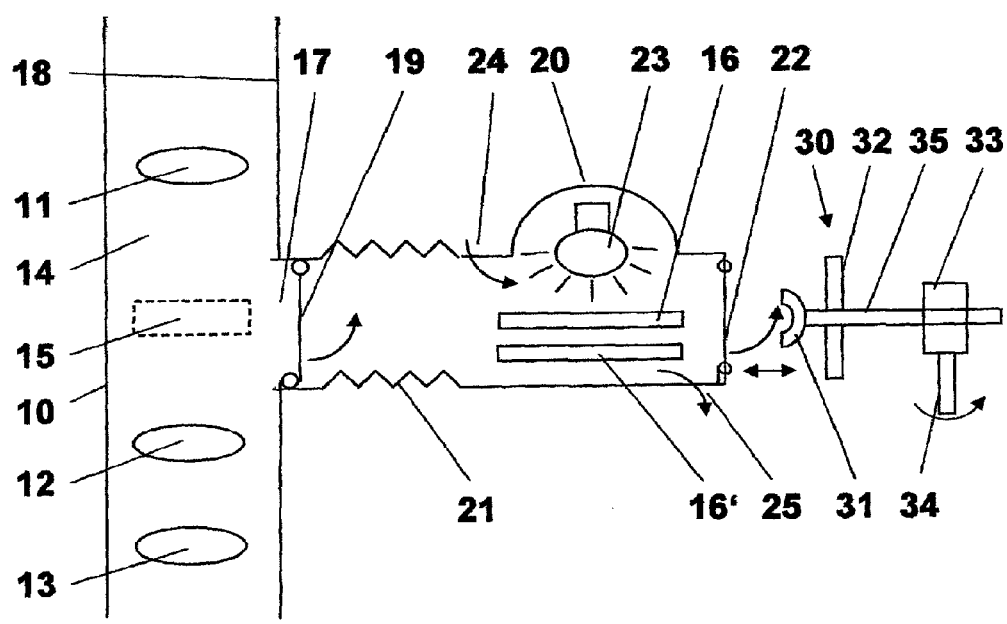

FIG. 1 is a purely schematic cross-section of a part of an objective 10, which has an objective housing 18, which surrounds the objective interior 14. In the objective interior 14 are arranged optical elements in the form of lenses 11, 12, 13.

Reference number 15 and corresponding dashed-lines indicate the position of a replaceable objective part 16, which can also be a lens or a filter or a diaphragm element.

The replaceable objective part 16, in accordance with the representation in FIG. 1, is accommodated in the cleaning room of the cleaning device 20, which is coupled or docked to the objective housing 18 in the area of position 15 of the replaceable objective part 16.

To this end, the cleaning device 20 has a connecting part 21, which interacts with an objective housing opening 17 in such a way that a gastight connection is created between objective interior 14 and the cleaning room of the cleaning device 20.

The cleaning device 20 is detachably arranged at the objective housing 18. In order that the objective housing opening 17 may be sealed gastight when the cleaning device is not arranged, an objective housing closure 19 is provided, which can be executed as a flap or slide. Sealing of the objective housing closure can be effected by generally known sealing elements, such as elastic elements or a so-called leaky seal, that is, a seal in which excess pressure prevents penetration by foreign substances.

The objective housing closure 19 is formed such that it can also be sealed when the cleaning device 20 is docked, in order that foreign substances may be prevented from gaining access to the objective interior 14 during cleaning in the cleaning device 20. The closure 19 opens only for transferring the replaceable objective part 16 in and out. Given sufficiently high gas flow from the objective into the cleaning device 20, the closure 19 can remain open during cleaning, since foreign substances are thereby prevented from gaining access to the objective interior 14.

The connecting part 21 is mechanically decoupled from the objective housing 18. This means that little or no vibrations which arise at or in the cleaning device 20 can be transmitted to the objective housing 18 and thus to the objective 10. Mechanical decoupling can proceed by appropriately designing the bearing of the cleaning device 20 at the objective housing 18. As an example of this, reference is made to the use of corresponding elastic elements, such as bellows arrangements or the use of air bearings.

The cleaning device 20 in the embodiment of FIG. 1 has a UV lamp 23, for example in the form of a mercury vapour lamp or Xerodex (xenon) lamp with broadband wavelength spectrum or in the form of an, in particular, pulsed UV laser having a correspondingly narrow (monochromatic) wavelength spectrum.

The cleaning device 20 is designed such that the replaceable objective part 16 for cleaning can be arranged in the irradiation region of the UV lamp 23, such that hydrocarbons on the objective part 16 can be eliminated by irradiation with UV light. In order that hydrocarbons transferred to the gas phase or part of the hydrocarbons may be removed from the cleaning room, the housing of the cleaning device 20 has a gas inlet opening 24 and a gas outlet opening 25. Connected to the gas inlet opening 24 is a gas supply with which a corresponding supply of cleaning gas can be introduced into the cleaning device 20. Candidate cleaning gases are dry nitrogen, dry air or helium. Dry nitrogen is especially preferred for projection or illumination objectives in microlithography, since such objectives typically already have a supply device for dry nitrogen, which device also can be used for the cleaning device 20.

The gas outlet 25 is connected to corresponding pump devices (not shown), which facilitate particularly good removal of the gaseous medium contained in the cleaning device 20. By means of the cleaning flow, the hydrocarbons or residues thereof transferred to the gas phase by the ultraviolet irradiation are removed from the cleaning room of the cleaning device 20.

The cleaning device 20 furthermore has a closing device 22, which, like the objective housing closure 19 can be realised by a flap or a slide and corresponding seals.

A replaceable objective part 16 for introduction into the position 15 of the objective interior 14 can be introduced into the cleaning device 20 from outside via the closing device 22.

To this end, a handling device 30 is available, which has a gripper 31, with which the replaceable objective part 16 can be gripped or accommodated. Also provided is a drive 34, for example in the form of an electric motor or in the form of a manual drive, which, via a transmission 33, can set the gripper 31 in linear motion in accordance with the double-headed arrow shown. With this, the replaceable objective part 16 can be introduced into the cleaning device 20 or removed from it.

In the embodiment shown in FIG. 1, the handling device 30 can be used for moving or transporting the replaceable objective part 16 within the cleaning device 20 or for transporting the replaceable objective part 16 from the cleaning device 20 into the objective interior 14 or, conversely, from the position 15 of the replaceable objective 16 in the objective interior 14 into the cleaning device 20. To this end is provided closure element 32, which, in the case of an opened closing device 22 of the cleaning device 20, is provided at the corresponding opening in order to seal it gastight. The gripper 31 is, for example, connected by a rod 35, which is guided through a gastight through-guide through the closure element 32, to the transmission 33, such that, in the event that the cleaning device 20 is closed, handling of the replaceable objective part 16 is possible.

Replacement of the replaceable objective part 16 proceeds in the following manner:

Where the replaceable objective part 16 at position 15 in the objective room 14 is to be replaced, the cleaning device 20 is docked by the connecting part 21 to the objective housing 18 in the region of the objective housing opening 17. In the cleaning device 20, the cleaning gas flow is then adjusted via the gas inlet 24 and the gas outlet 25 and the cleaning room, in order that the ambient air contained in the cleaning device 20 may be flushed out. Then, the objective housing closure 19 is opened and, by means of the handling device 30, which is connected gastight to the cleaning device 20 by the closure element 32, the replaceable objective part 16 is gripped by means of the gripper 31 and moved in the direction of the cleaning device. To this end, drive 34 is actuated, such that the gripper 31 is retracted in the direction of the cleaning device 20 via the transmission 33.

Once the replaceable objective part 16 is inside the cleaning device 20, the objective housing closure 19 can be closed again and the replaceable objective part 16 removed from the cleaning device 20 via the closing device 22.

Now a further or appropriately prepared replaceable objective part 16 can be reintroduced into the objective 10 in the opposite direction. To this end, the objective part 16 located at the gripper 31 is introduced into the cleaning device 20 in such a way that it comes to lie in the position shown in FIG. 1. The closure element 32 of the handling device 30 seals the opening of the closing device 22 of the cleaning device 20 gastight.

Then, cleaning can begin, with the UV lamp 23 being switched on in order that the hydrocarbons, which are located on the surface of the objective part 16, may be evaporated or decomposed. The hydrocarbons or hydrocarbon fractions transferred thereby into the gas phase are discharged from the cleaning device 20 through the gas outlet 25 by the cleaning gas introduced through gas inlet 24. Candidate cleaning gas is nitrogen, dry air or helium or other inert gases or noble gases.

Since the decomposition of the hydrocarbons is supported by the presence of a certain quantity of water molecules, i.e. a concentration of water in the ppm range, it is also possible to use cleaning gas which is not especially dry and/or to commence cleaning immediately after the introduction of the replaceable objective part 16. In the further sequence, water is also removed by the cleaning gas.

After cleaning has taken place, the objective housing closure 19 is opened either under maintenance of the cleaning flow or after closure of the gas inlet 24 and the gas outlet 25, in order that the cleaned objective part 16 may be transferred to its position 15 in the objective interior 14 by means of the handling device 30. As soon as the objective part 16 is in its place in the objective 10, the objective housing closure 19 can be closed again and the cleaning device 20 removed from the objective housing.

By virtue of the described method using the cleaning device 20, it is no longer necessary on one hand to provide additional load-lock devices during removal of replaceable objective parts 16 since the cleaning device 20 can take on the load-lock function. In addition, the cleaning device 20 and the cleaning of the objective part 16 immediately prior to its introduction avoids laborious cleaning within the objective.

This advantage is increased especially if the cleaning device 20 is designed such that two objective elements 16 and 16' can be accommodated in it. In this case, the new objective part 16 can then be cleaned in the cleaning device 20 for a certain period of time, while the old objective part 16' is still located in the objective 10, such that this can be operated further during cleaning of the new objective part 16. Once cleaning of the new objective part 16 is complete, the old objective part 16' is first removed from the objective 10, stored temporarily in the cleaning device 20, as shown in FIG. 1, and the new objective part 16 is introduced into the objective 10. Then, the old objective part 16' can be removed from the cleaning device 20 or the entire cleaning device removed from the objective housing 18. In this way, particularly short replacement times can be realized.

This applies even more if removal of the one objective part from the objective and the introduction of the other objective part 16 into the objective 10 occur in a common process step, i.e. the same handling device is used to move the one objective part 16' from the objective 10 and to introduce the other objective part 16 into the objective at the same time, such as on a turntable or the like.

It can prove advantageous in this connection for a magazine to be provided at the cleaning device, in which magazine replaceable objective parts 16, 16' can be stored. Although such a device is not explicitly depicted in the attached drawings, it can however be easily realized by an attached gastight room, in which the same atmosphere exists as in the cleaning room or a special atmosphere which is particularly suitable for clean storage of the objective parts.

Figure 2:
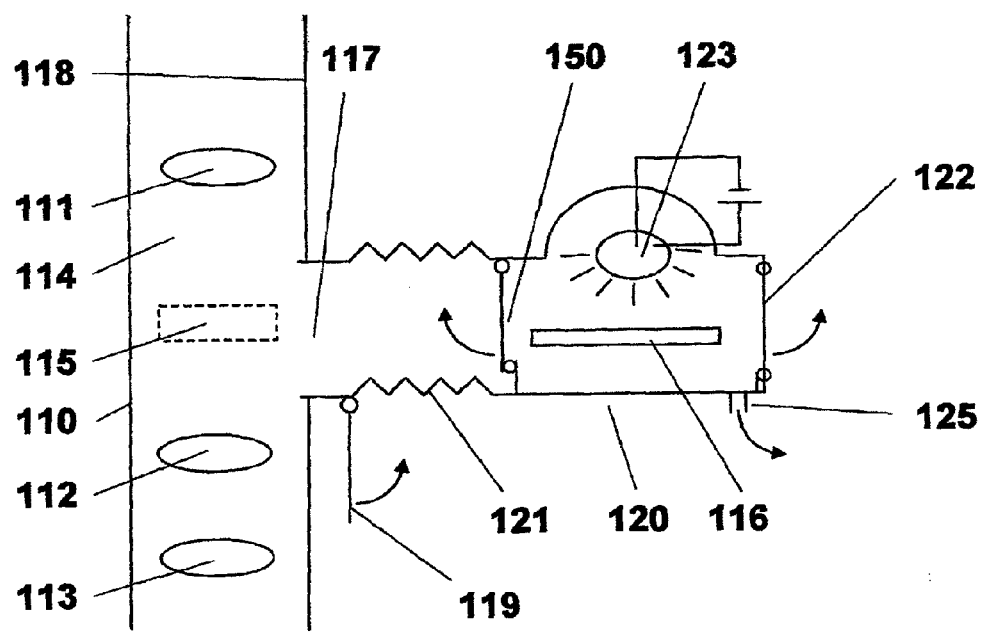
FIG. 2 a cross-section of a part of an objective with a further docked cleaning device.

FIG. 2 shows a further embodiment of an inventive cleaning device 126 interacting with an inventive objective 110, with, again, a purely schematic cross-sectional view being shown.

The embodiment of FIG. 2 corresponds in large part to that of FIG. 1, such that similar or identical components having the same reference symbols have had their numbers increased by 100. A repeat description of the corresponding components is therefore unnecessary. The description of FIG. 2 is therefore limited only to differences in the embodiment.

The embodiment of FIG. 2 differs from that of FIG. 1 essentially in that, instead of a UV lamp 23, a microwave head 123 is used to generate a plasma. By means of the microwave head 123, a plasma can be excited in the cleaning room, said plasma being used to clean the surface of the replaceable objective part 116.

To excite the plasma, a vacuum is generated in the cleaning room of the cleaning device 120, said vacuum being generated by corresponding suction or pump devices (not shown), which are connected to the outlet 125. Since no additional gas needs to be introduced in the case of the cleaning device 120, there is no need for a gas inlet 24 of the kind shown in FIG. 1. However, for the purpose of generating a plasma, a gas atmosphere, such as hydrogen, oxygen or argon atmosphere may be adjusted, too, for which purpose then only a corresponding gas inlet (not shown) with corresponding gas supply would need to be provided.

The cleaning device 120 serves especially to remove the water monolayers. Removal of the water is promoted by the creation of a vacuum, since in that event a fraction of the water monolayers on the replaceable objective part 116 is removed by evaporation.

Once a stable vacuum has been established, the plasma excited by the microwave head 123 effects removal of the water monolayers from the surface of the objective part 116, which are then removed by the vacuum suction.

The cleaning device 120 can also be combined with the cleaning device 20, with, for example, the cleaning device 20 capable of being connected to the closing device 122, such that a replaceable objective part 116, on being introduced into the objective 110, is first cleaned of hydrocarbons in the cleaning device 20 and freed of the water monolayers in a further step in the cleaning device 120.

The embodiment of FIG. 2 differs furthermore from the embodiment of FIG. 1 in that the objective housing closure 119 of the objective 110 is arranged such that, when the cleaning device 120 is docked, it is arranged outside of it and can no longer be closed. Instead, the connecting part 121 of the cleaning device 120 has an additional connecting part closure 150, with which the cleaning room of the cleaning device 120 can be separated from the objective interior 114 during the cleaning process.

Figure 3:
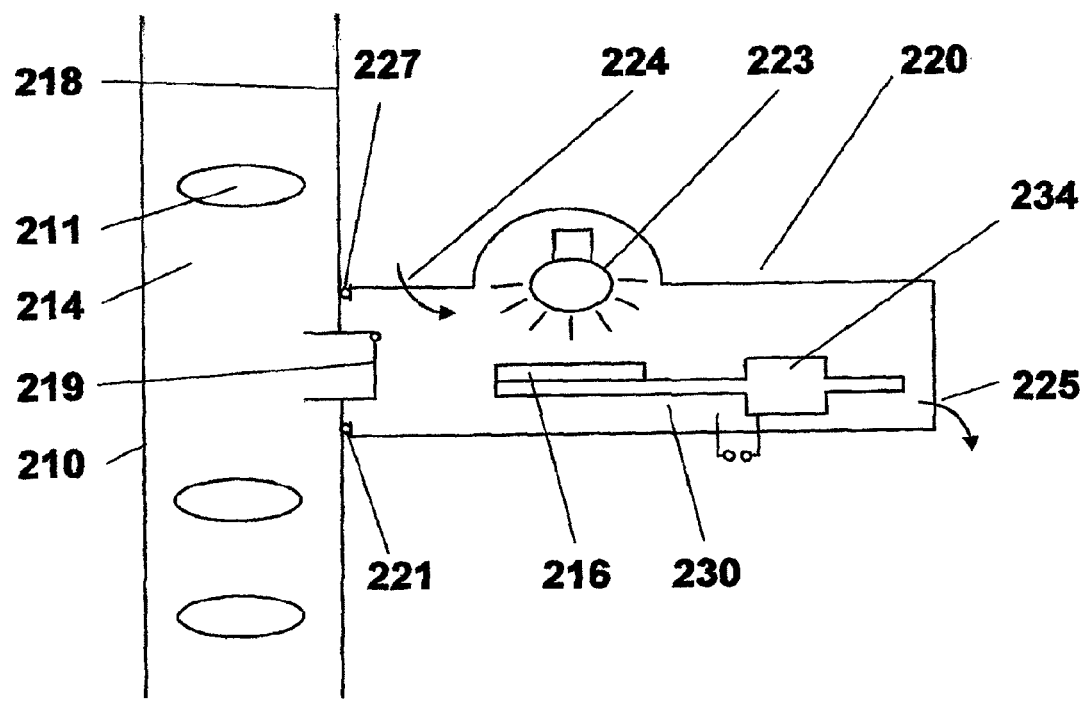
FIG. 3 a cross-section of a part of an objective with a third embodiment of a docked cleaning device.

FIG. 3 shows a further embodiment of an inventive objective and a cleaning device 220 interacting with it. Again, as in embodiment 2, similar or identical components are provided with identical reference symbols, with, in turn, the reference numbers being 200 higher than in FIGS. 1 and 100 higher than the reference numbers of FIG. 2. Here, too, an additional description of components already discussed is eschewed.

FIG. 3 shows in addition to FIGS. 1 and 2 sealing elements 227 in the region where the cleaning device 220 is connected to the objective housing 218. In the simplest case, these may be O-rings or other tensioned elastic elements, such as metal seals, that guarantee a gastight seal. Alternatively, a leaky seal may be chosen if, by means of corresponding excess pressure in the objective 210 or the cleaning device 220, it is ensured that no foreign substances can gain entry into the objective 210 or the cleaning device 220.

Further, FIG. 3 shows that the handling device 230 can also be fully accommodated in the cleaning device 220, such that elaborate gastight through-guides for movable parts can be eschewed. Rather, with such a simple embodiment, it is necessary only to guide the electrical connecting cable gastight through the housing of the cleaning device 220 in order, for example, that an electric power supply for the drive 234 of the handling device 230 may be ensured.

In this embodiment, an additional closing device 22 or 122, as in the embodiments of FIGS. 1 and 2, can be eschewed because accommodation and release of the replaceable objective part 216 in the removed state from the objective can be effected through the opening of the connecting part 221.

To prevent generation of particles by the drive 234 and any transmission provided for the handling device 230 or to avoid the need to provide gastight through-guides for movable parts, such as the rod 35 of the handling device 30, a contactless, externally driven handling device (not shown) may also be provided, which functions, for example, by magnetic forces. An example of this would be a linear motor.

Figure 4:
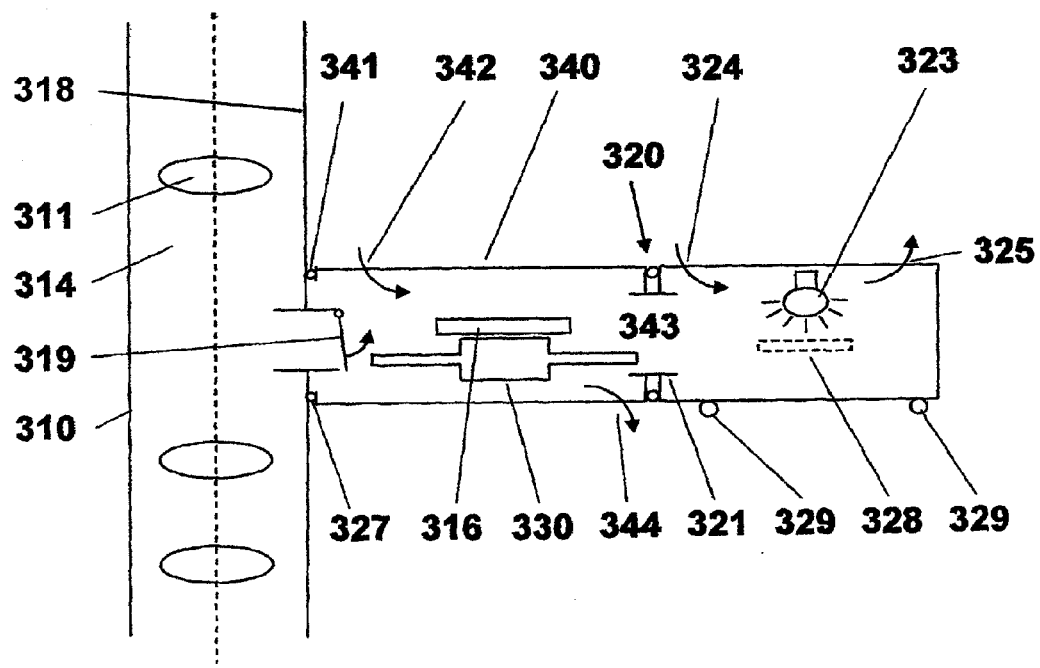
FIG. 4 a cross-section of a part of an objective with docked transport channel as well as a fourth embodiment of a cleaning device.

FIG. 4 shows a fourth embodiment of a cleaning device 320 in cooperation with an objective 310, also in a schematic cross-section like the previous depictions of FIGS. 1 to 3.

Here, again, identical or similar components have identical reference numbers, but have been increased by 300 relative to FIG. 1, by 200 relative to FIG. 2 and by 100 relative to FIG. 3. Accordingly, here, too, an additional description of components already described is eschewed, and only additional components and parts are described in detail.

FIG. 4 shows a transport channel 340 as a component of the cleaning device 320, which channel, however, can be separated from the actual cleaning room 328, in which cleaning room the dashed lines represent the position of the replaceable objective part 316 during cleaning.

In the embodiment shown in FIG. 4, the transport channel 340 accommodates the handling device 330. However, the transport channel 340 can also be designed so as not to have a handling device.

The cleaning channel 340 has a connecting element 341, which, corresponding to connecting parts 21, 121 and 221, can be connected to the objective housing 318.

Moreover, the transport channel 340 has a corresponding connecting element 343 for connection to the cleaning room 328.

Corresponding sealing elements for providing a gastight connection are provided at connecting elements 341 and 343.

Furthermore, the transport channel 340 also has a gas inlet 342 and a gas outlet 344 to enable flushing of the transport channel 340, too.

The embodiment of FIG. 4 differs furthermore from all previous embodiments in that the gas inlet 324 and the gas outlet 325 are arranged on the same side of the housing of the cleaning room 328 or the cleaning device 320, in contrast to the previous examples in which gas inlet 24, 224 and gas outlet 25, 225 are provided on opposite sides of the housing, more precisely diametrically opposite each other, in order that gas exchange may be maximized by the cleaning flow.

Furthermore, FIG. 4 shows that the housing of the cleaning room 328 has wheels 329, which schematically are intended to convey that the cleaning device 320 can have a transport mechanism for facilitating and executing in a defined manner the movement of the cleaning device 320, especially during docking and undocking to the objective housing. Apart from wheels, sliding elements in conjunction with rails and the like are conceivable.

Figure 5:
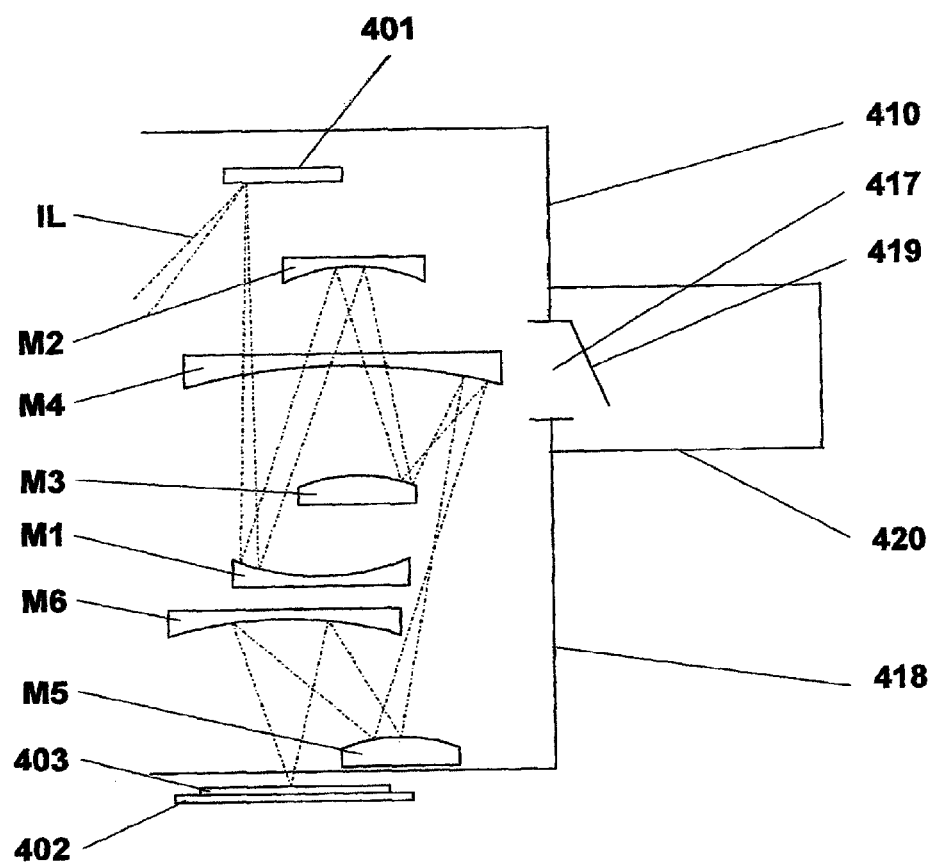
FIG. 5 a cross-section of an EUV projection objective with docked cleaning device.

FIG. 5 shows the application of the present invention in an EUV projection objective 410. This exemplifies that the present invention can be flexibly used in all kinds of optical systems, such as illumination systems or projection optics, which work at different wavelength ranges, in microlithography.

The EUV projection objective 410 has a vacuum vessel 418, which is shown only in purely schematic form. In the vacuum vessel 418 are arranged the reticle 401 with the structures to be imaged as well as the mirrors M1 to M6, said mirrors imaging the light coming from an illumination system IL (not shown) and reflected at reticle 401 onto a wafer (substrate) 403, which is located on a wafer stage (substrate holder) 402. As a result, the structure of the reticle 401 is imaged in reduced form onto a photosensitive layer on the wafer 403.

The vacuum vessel 418 has a vacuum vessel opening 417, which comprises a vacuum vessel closure 419, such that the vacuum vessel opening 417 can be sealed vacuum-tight in order that the vacuum in the vacuum vessel 418 may be maintained.

In order that an objective part, namely the mirror M4, may be replaced, a cleaning device 420 can be docked vacuum-tight to the vacuum vessel 418, such that, after opening of the vacuum vessel closure 419, inside the cleaning device 420 and in the objective interior of the vacuum vessel 418 a vacuum can be maintained.

The cleaning device 420 is merely shown in schematic form and can be formed according to the embodiments of the examples in FIGS. 1 to 4. Thus, the mirror M4 can be replaced via the cleaning device 420 in accordance with the preceding examples. Instead of the mirror M4, further objective parts can be provided for replacement, especially diaphragms for the mirrors M1 to M6. Especially, the cleaning device can be used with a diaphragm-changing system, as described in US 2007/0053076 A1. Correspondingly, US 2007/0053076 A1 is hereby incorporated into the present application by reference in its entirety. The cleaning device can, in the case of US 2007/0053076 A1, be provided in combination with the diaphragm magazine, more precisely for the purpose of cleaning prior to introduction into the magazine and/or during transfer from the magazine into the optical arrangement. Furthermore, parts of diaphragm-changing system of US 2007/0053076 A1 can be integrated into the cleaning device, such as the magazine, or conversely, the cleaning device into the diaphragm-changing system, such as cleaning devices in the magazine or a diaphragm-transport path.

In FIG. 5, the EUV projection optics 410 are shown only with a vacuum vessel 418. However, the EUV optics can comprise further housing parts (not shown), which surround individual elements, such as mirrors, or the light path, in order that a different atmosphere, such as a different vacuum state, may be adjusted in surrounded regions. Such a design of an optical arrangement is described in PCT/EP2007/008113, which is hereby incorporated into the present application by reference in its entirety. The cleaning device described in the present application or the corresponding method for replacing objective parts can also be used for such optical configurations.

Figure 6:
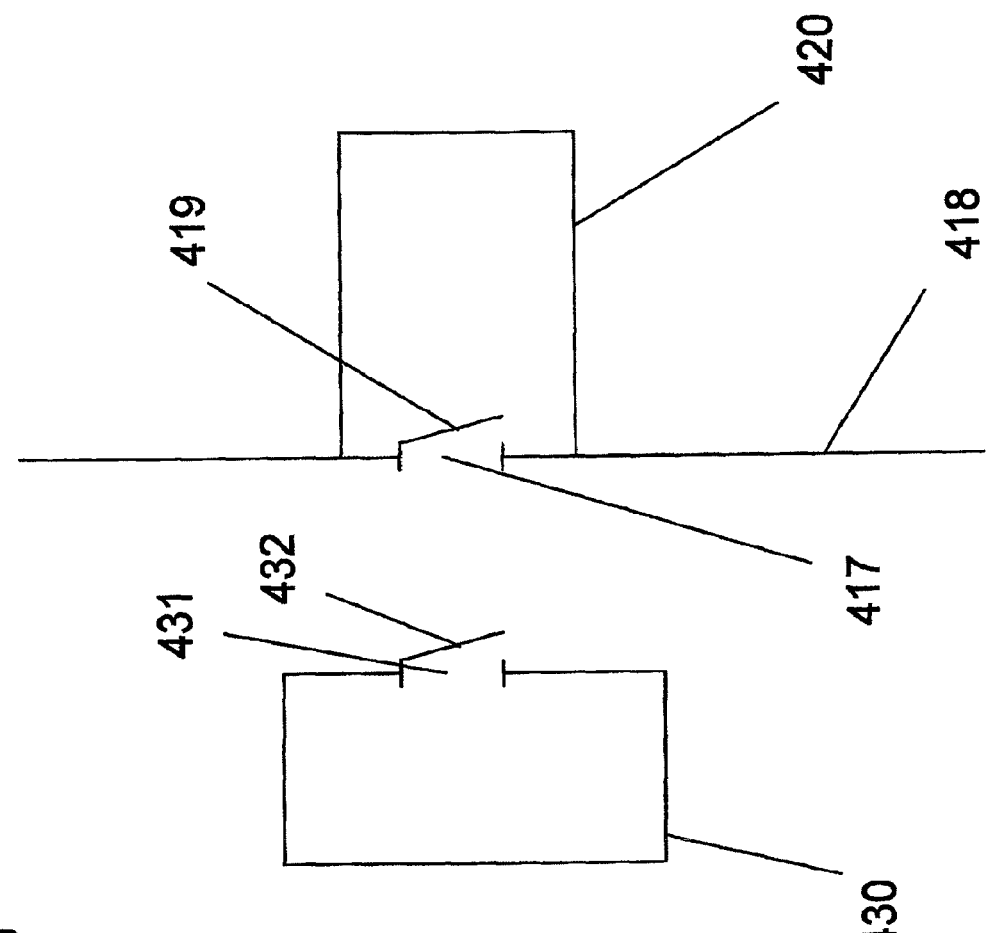
FIG. 6 a partial view of a further EUV optics similar to that in FIG. 5.

The cleaning device can in this regard be provided at the outer vacuum vessel 418, as shown in FIG. 5, while only a corresponding replacement opening is to be provided in an inner housing part. This is shown schematically in FIG. 6. FIG. 6 shows a detail of the vacuum vessel wall 418, at which is provided a vacuum vessel opening 417 for the replacement of corresponding optics parts. The vacuum vessel opening 417 can be sealed vacuum-tight with the vacuum vessel closure 419. For the purpose of replacing a corresponding objective or optics part, the cleaning device 420, as described exemplarily in FIGS. 1 to 4, is flanged to the vacuum vessel wall 418. Provided on the left side of the vacuum vessel wall 418, i.e. inside the vacuum vessel, is a further housing 430, in which one or more components of the optical arrangement can be accommodated in order that atmospheric conditions different from those of the external vacuum vessel may be adjusted. For the replacement of an appropriate optics or objective part, a housing opening 431 is provided, which also can accordingly be sealed vacuum-tight via a housing closure 432. For the replacement of an optics part, only the closures 432 and 419 now need to be opened so that that an optics part can be transferred from the housing 430 into the cleaning device 420 and vice versa.

Figure 7:
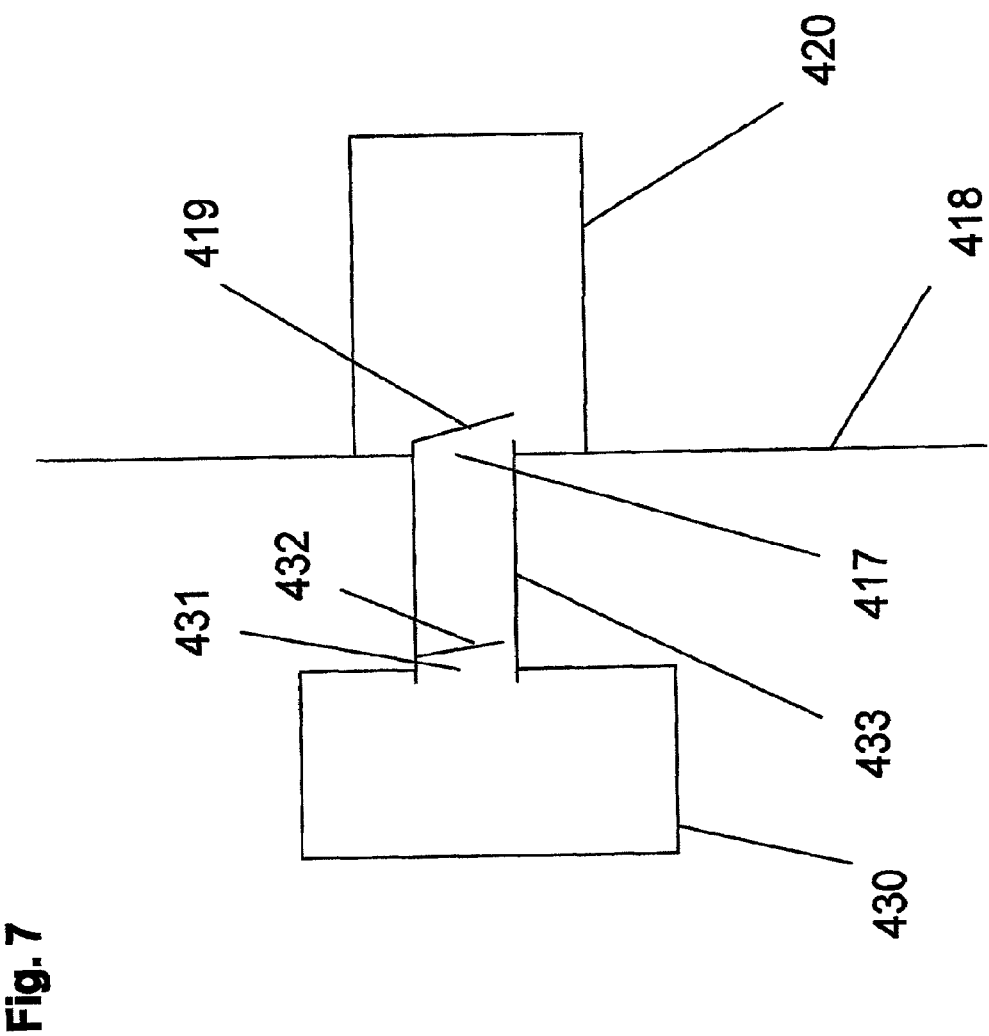
FIG. 7 a partial view of a third EUV optics similar to that in FIG. 5.

FIG. 7 shows a further embodiment in which, provided between the housing opening 431 and the vacuum vessel opening 417, is a transport channel 433 in order that the part to be replaced may be transferred from the housing 430 into the cleaning device 420 direct or vice versa, without coming into contact with the interior of the external vacuum vessel.

Although the present invention has been described in detail in relation to the embodiments presented, the person skilled in the art will appreciate that the invention is not restricted to these embodiments, but rather that modifications, especially in the form of combinations of individual components or omission of certain individual items, can be realized without departing from the subject matter of the invention. The applicant seeks, therefore, to cover all such changes and modifications as fall within the spirit and scope of the invention, as defined by the appended claims, and equivalents thereof.

What is claimed is:

1. A method, comprising:
   providing an objective having an objective interior and objective parts provided therein, an objective part of the objective parts being replaceably accommodated in the objective interior, wherein the objective interior is sealed off from an ambient atmosphere by a closure,
   providing a cleaning room that is unattached to the objective; and
   further comprising the following operations performed in sequence as herein below recited:
      attaching the cleaning room to the objective at the closure such that the closure, when opened, provides access from the objective interior into an interior of the cleaning room, wherein attaching the cleaning room to the objective comprises sealing off the interior of the cleaning room and the objective interior from the ambient atmosphere,
      opening the closure and removing the objective part completely from the objective interior into the cleaning room,
      closing the closure to seal off the objective interior from the interior of the cleaning room and to seal off the interior of the cleaning room from the objective interior,
      cleaning a replacement objective part arranged in the interior of the cleaning room while the interior of the cleaning room is sealed off from the ambient atmosphere and from the objective interior, and thereby producing impurities in the cleaning room,
   discharging the impurities from the cleaning room into the ambient atmosphere,
   after the cleaning and the discharging, and while the cleaning room is attached to the objective, opening the closure and installing the replacement objective part without the impurities in the objective interior while the cleaning room and the objective interior are sealed off from the ambient atmosphere,
   sealing the objective interior, including the replacement objective part installed therein, from the ambient atmosphere and the cleaning room;
   detaching the cleaning room from the objective; and
   operating the objective by irradiating the replacement objective part with objective light,
   wherein the objective part comprises at least one of an optical element imaging the objective light reflected and/or refracted from a reticle and an optical element of an illumination projection system imaging the objective light onto a reticle.

2. Method in accordance with claim 1, wherein
the objective part is selected from the group consisting of optical lenses, mirrors, mirror elements, filters, diaphragms, and membranes.

3. Method in accordance with claim 1, wherein
the interior of the cleaning room has a cleaning atmosphere differing from the ambient atmosphere.

4. Method in accordance with claim 3, wherein
the cleaning atmosphere is selected from the group consisting of vacuum, dry air, nitrogen, dry nitrogen, argon, oxygen, helium, hydrogen, at least one inert gas, at least one noble gas and combinations thereof.

5. Method in accordance with claim 1,
wherein the cleaning room sealed off from the ambient atmosphere is provided in local proximity to the objective interior, and
further comprising moving the replacement objective part, through at least one of a geometrically simple and a temporally short movement, from the interior of the cleaning room into the objective interior.

6. Method in accordance with claim 1, further comprising
providing at least one further cleaning room, the cleaning rooms being respectively connected to each other, and
passing the replacement objective part through the cleaning rooms in succession.

7. Method in accordance with claim 1, wherein
the cleaning in the cleaning room comprises at least one of: cleaning by irradiation with electromagnetic waves, cleaning by irradiation with ultraviolet radiation, plasma cleaning, oxygen plasma cleaning, hydrogen plasma cleaning, evaporation, gas cleaning, liquid cleaning, ultrasonic cleaning, dipping in at least one bath, mechanical cleaning, and wiping.

8. Method in accordance with claim 1, wherein
the cleaning in the cleaning room comprises at least one of elimination of particles, elimination of hydrocarbons, elimination of water monolayers and elimination of combinations thereof.

9. Method in accordance with claim 8, wherein
the elimination of particles comprises at least one of utilizing an ultrasonic bath, utilizing a dipping bath in an optics-cleaning mixture, and wiping.

10. Method in accordance with claim 8, wherein
the elimination of hydrocarbons comprises at least one of utilizing irradiation, utilizing irradiation with broadband ultraviolet light, gas flushing, gas flushing with dry nitrogen, gas flushing with dry nitrogen and admixed oxygen, gas flushing with dry nitrogen and admixed dry air, plasma cleaning, and plasma cleaning with an oxygen plasma excited by microwave energy in vacuum conditions with simultaneous suction of the cleaning room.

11. Method in accordance with claim 8, wherein
the elimination of water monolayers comprises at least one of evaporation, heating with an infrared lamp, heating with a heating wire, plasma cleaning, flushing with dry nitrogen, flushing with dry air, and flushing with helium.

12. Method in accordance with claim 1, further comprising
providing a magazine for the replacement objective part and further objective parts.

13. Method in accordance with claim 1, wherein
the objective part is a part of an optical system configured for one of ultraviolet and extreme ultraviolet lithography.

14. Method in accordance with claim 1, wherein
the objective is an objective of a projection or illumination objective for microlithography.

15. Method in accordance with claim 1, wherein
sealing the objective interior, including the replacement objective part, from the ambient atmosphere and the cleaning room comprises again closing the closure.

16. Method in accordance with claim 1, wherein
the cleaning room is sealed off from the ambient atmosphere before the cleaning room is attached to the objective at the closure.

17. Method in accordance with claim 1, wherein
the cleaning room is sealed off from the ambient atmosphere after the cleaning room is attached to the objective at the closure.

18. Method in accordance with claim 1, further comprising
handling the objective part.

19. Method in accordance with claim 18, wherein
the handling comprises at least one of:
moving the objective part within the cleaning room;
moving the objective part within the objective interior; or
transporting the objective part between the objective and the cleaning room.

20. A method for cleaning a replacement objective part of an objective, in a cleaning device interior, wherein an objective housing interior and the cleaning device interior are sealed from an ambient atmosphere, comprising the following operations performed in sequence:
attaching the objective housing to a cleaning device at an objective housing closure;
opening the objective housing closure to form a direct passage between the cleaning device interior and the objective housing interior when the cleaning device is attached to the objective house;
moving a first-objective part from the objective housing interior to the cleaning device through the direct passage;
closing the closure to form a vacuum-tight closure between the objective housing interior and the cleaning device interior;
cleaning a replacement objective part arranged in the cleaning device interior, wherein the cleaning device interior is sealed from the ambient atmosphere and wherein the replacement objective part comprises a second objective part to be placed in the objective housing interior after cleaning or the first objective part to be placed in the objective housing interior after cleaning;
opening the closure;
installing the replacement objective part to the objective housing interior;
closing the closure to form a vacuum-tight closure between the objective housing interior and the ambient atmosphere; and
detaching the cleaning device; and
operating the objective by irradiating the replacement objective part with objective light.

* * * * *